Jan. 11, 1955 T. NIETER 2,699,424

ELECTROPLATING PROCESS FOR PRODUCING PRINTED CIRCUITS

Filed Oct. 7, 1949 2 Sheets-Sheet 1

INVENTOR.
Temple Nieter
BY Foorman L. Mueller
Atty.

ELECTROPLATING PROCESS FOR PRODUCING PRINTED CIRCUITS

Filed Oct. 7, 1949 2 Sheets-Sheet 2

INVENTOR.
Temple Nieter
BY Norman L. Mueller
Atty.

United States Patent Office 2,699,424

Patented Jan. 11, 1955

2,699,424

ELECTROPLATING PROCESS FOR PRODUCING PRINTED CIRCUITS

Temple Nieter, Evanston, Ill., assignor to Motorola, Inc., Chicago, Ill., a corporation of Illinois Application October 7, 1949, Serial No. 120,165

5 Claims. (Cl. 204—15)

This invention relates to methods of forming electric conductors on insulating bases, and particularly to methods for the deposition of electric conductors by electrochemical action upon insulating bases. Copending application Serial Number 297,285 entitled "Electroplating Process" filed July 5, 1952, is a continuation in part of this application.

In forming an electric conductor upon an insulating base, it has been proposed to coat the base uniformly with a thin layer of an electrically conductive material (such as silver), then mask those areas of the coated base on which no conductor is desired and electroplate the remaining area with a second layer of a different conductive material (such as copper) to form the electric conductor. Thereafter, both the masking material and the unplated underlying parts of the first conductive layer are removed, leaving only the desired conductor on the insulating base. Prior methods of this character have been subject to several disadvantages. The masking materials proposed heretofore have not been capable of resisting prolonged electrolytic action to the extent necessary for effectively preventing the deposition of metal where it is not wanted on the base. Moreover, the agents that are used for removing the unwanted parts of the first layer are likely to attack the second layer also, resulting in an unsatisfactory product.

An object of the present invention is to provide an improved method of forming electric conductors on insulating bases which avoids the disadvantages just mentioned.

Another object is to provide a simple and reliable method of forming electric conductors on insulating bases, which method entails the use of cheap, common materials and inexpensive production techniques.

Still another object is to produce an electroplated pattern on an insulating base with a high degree of precision.

A further object is to produce an electric conductor on an insulating base by a combination of silver coating and copper plating steps, and to remove the excess silver with no detrimental effect upon the copper plating.

A feature of the invention is the use of a silk screen stencil and a suitable electrolytic resist (such as lacquer) for masking certain areas of a silver-coated insulating base prior to the immersion of the base in an electroplating bath. The stenciling of the resist directly upon the base is found to be more satisfactory than prior methods of forming a mask or negative.

Another feature is the novel manner of removing excess silver which involves the use of a cheap conversion agent (such as ordinary bleach, sodium hypochlorite) that converts the silver to a non-conductive material which is readily soluble in a common cleaning agent (such as sodium thiosulphate or ammonia) without affecting the deposited copper.

In an alternative form of the invention a chromic acid solution is employed for converting the unplated silver film into a chromate that is readily removed from the base without affecting the copper deposit.

The foregoing and other objects and features will be better understood from a study of the following description taken in connection with the accompanying drawings, wherein.

In practicing the invention, a silk screen stencil is prepared with the desired pattern thereon. The insulating base is silvered, and the resist is then squeegeed onto the silver-coated base through the silk screen stencil. This serves to mask those areas of the base on which no conductor is desired, leaving unmasked those areas on which a conductor or conductors (or a guard ring) may be desired. After the resist is hardened, the article is placed in an electroplating bath to deposit copper on the exposed silver areas. The copper is built up to the requisite thickness, and the resist then is removed, leaving bare the unplated portions of the silver coating. A conversion agent such as bleach or chromic acid is applied to the article, converting the exposed silver to a non-conductive material. This non-conductive material is soluble in a cleaning agent such as photographers' hypo (sodium thiosulphate) or ammonia. The finished article, after cleaning, consists of the insulating base bearing copper strip conductors which are superimposed upon metallic silver, with the silver being confined in its extent to the areas underlying the copper conductors.

Figure 1:
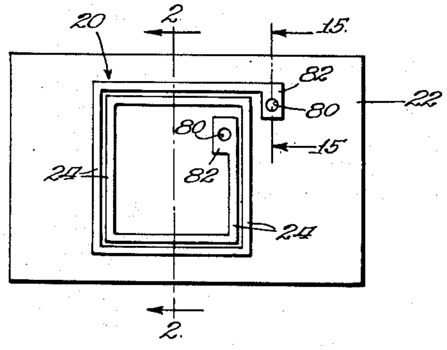
Figs. 1 and 2 are plan and cross-sectional views, respectively, of an article made in accordance with the principles of the invention.
Figure 2:
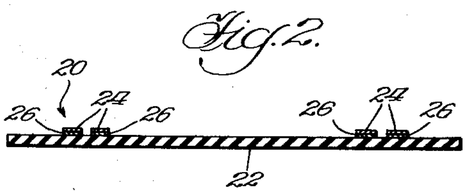
Figure 3:
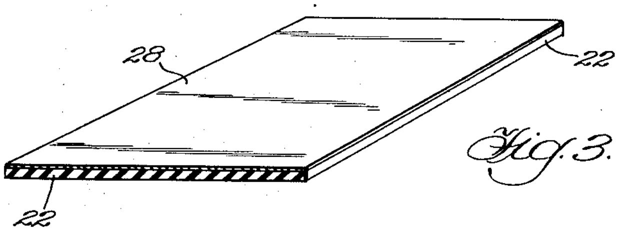
Fig. 3 is a perspective view, partially sectional, showing an insulating base which has been coated with silver as the first step in the disclosed process.
Figure 4:
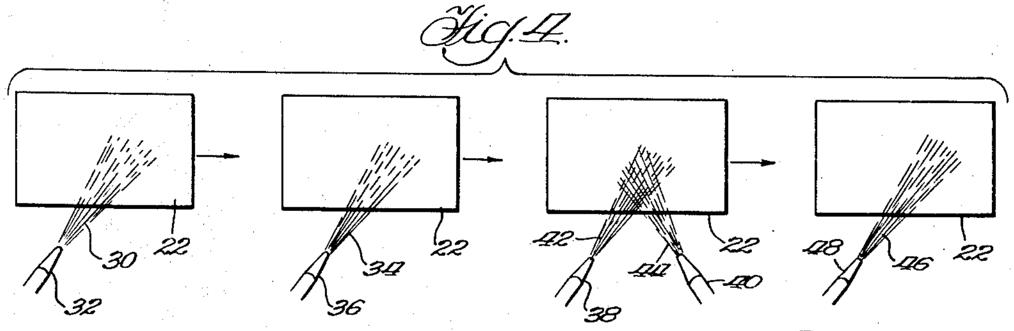
Fig. 4 is a series of schematic elevational views showing various steps involved in producing the article illustrated in Fig. 3.

Figs. 1 and 2 illustrate a fixed tuning coil 20 adhering to an insulating base 22. The coil 20 may be considered as a single conductor in the form of a loop or, alternatively, as individual, interconnected conductors 24 which constitute the turns of the coil. Each of the conductors 24 consists of a strip of copper which overlies a thin layer or film 26 of silver. The various steps involved in the formation of this article are as follows:

The insulating base 22 is first coated uniformly with metallic silver as indicated in Fig. 3, wherein the silver layer or film is designated by the numeral 28. Fig. 4 illustrates the sequence of operations involved in silver-coating the base 22. A sensitizing solution 30 such as stannous chloride ($SnCl_2$) is sprayed from a nozzle 32 onto the base 22. The base 22 then is washed with a water spray 34 from a nozzle 36, leaving a slight trace of the sensitizer on the base. The base 22 then is subjected to a dual spray from the nozzles 38 and 40, one of these sprays being a silver salt solution 42 while the other spray is a reducing solution 44. The streams 42 and 44 unite at the surface of the base 22, and the silver salt solution is reduced to metallic silver. The silvered base 22 then is washed by a water spray 46 from a nozzle 48 and is dried, producing the silver-coated base 22 as illustrated in Fig. 3. These same steps can be performed by immersion rather than by the spray method, if desired, but immersion is less preferable except for small batches.

The optimum thickness of silver on the base 22 is that which produces a resistance of from 1 to 2 ohms as measured between prods one inch apart on an area which need not exceed two inches square. (Any greater area will not alter the resistance appreciably.) If the silver layer is thicker than this, it may not be easily removed after the copper plating step. On the other hand, if the silver layer is too thin, it may not have a sufficiently low resistance to carry the desired copper plating current.

Figure 5:
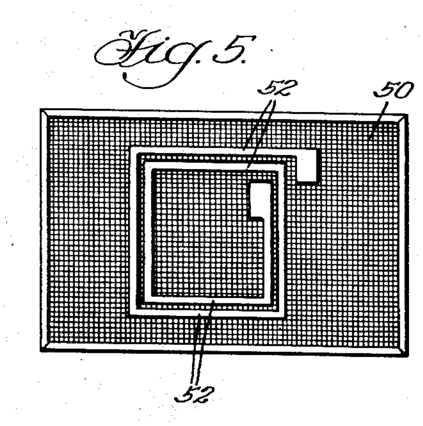
Fig. 5 is a plan view of a silk screen stencil employed for applying resist to the silvered base.

In applying the resist to the silvered base, a silk screen stencil 50, Fig. 5, is employed. The required coil design is first laid out by drafting methods, printing or in any other suitable fashion upon a white surface, using black marks wherever the copper conductors are to be formed. The lines may be created originally to any desired scale such as will permit photographic reduction to the actual required size. The silk screen stencil is prepared by conventional methods from the printed or drafted design, with those areas of the stencil 50 that correspond to the design being blanked off as indicated at 52.

A suitable resist which is proof against electrolytic action must be employed in masking those areas of the silver base 22 (Fig. 3) on which copper is not to appear. Lacquer has been found to be highly satisfactory for this purpose. The stencil 50 is laid upon the base 22, and the lacquer is applied by a squeegee 54, Fig. 6, or in any other conventional fashion. It is contemplated also that the resist may be printed onto the base, although the stencil is preferred because it provides a greater thickness of resistant material.

Figure 7:
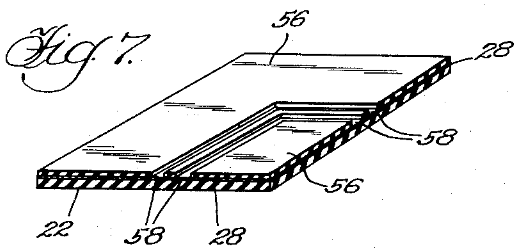
Fig. 7 is a perspective view, partially sectional, illustrating the stenciled base.

The lacquered base is shown fragmentarily in Fig. 7. The thickness of the resist 56 relative to the base 22 is exaggerated in this view for clarity. The resist 56 masks all areas of the silver layer 28 except those corresponding to the positions of the conductors 24 (Fig. 1) in the finished product. Thus, referring to Fig. 7, interruptions 58 in the resist layer 56 expose the silver layer 28 wherever copper is to be deposited.

Figure 8:
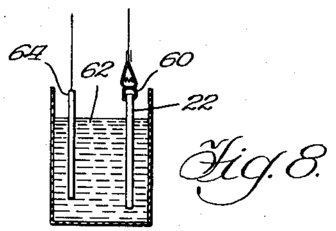
Fig. 8 represents the electroplating step in the process.
Figure 10:
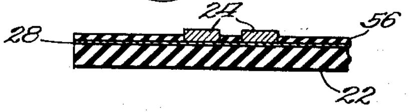
Fig. 10 is a cross-section of the electroplated article prior to the removal of the resist.
Figure 9:
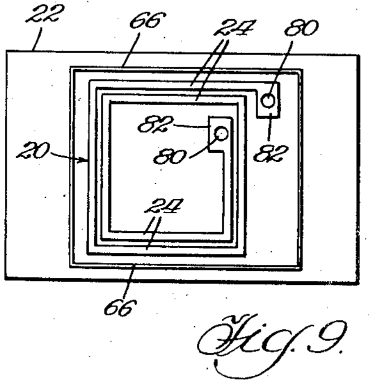
Fig. 9 is a plan view of a modification which employs a guard ring, stenciled at the same time as the rest of the pattern, to improve the electroplating.

After being coated with the silver 28 and the resist 56 as shown in Fig. 7, the base 22 is baked or dried in an oven to harden the resist 56. The article then is suspended by a clip 60, Fig. 8, in a copper electroplating bath 62. The silver coating 28 on the base 22 forms one electrode. Another electrode 64 is suspended in the bath 62 as shown. The article is kept in the bath subject to electrolytic action for a sufficient length of time to build up the required thickness of copper on the exposed silver areas. As shown in Fig. 10, the copper strips 24 may be built up to a thickness exceeding that of the resist layer 56. If the copper displays any tendency to "grow" sideward, a guard ring 66, Fig. 9, may be employed. This guard ring 66 is formed by stenciling and plating, as in the case of the conductors 24, and it absorbs the excessive edge plating which otherwise would be deposited on the conductors 24. The result is a clean, sharply defined conductor.

The recommended composition for the plating bath is 32 ounces of copper sulphate per gallon and 8 ounces of sulphuric acid per gallon, and if brightening is required, ½-gram of thiourea is used per 20 gallons of the final solution. This brightener also tends to prevent side growth of the flat copper strips.

Figure 11:
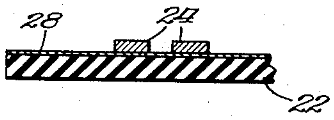
Fig. 11 is a sectional view representing the article after the removal of the resist.
Figure 12:
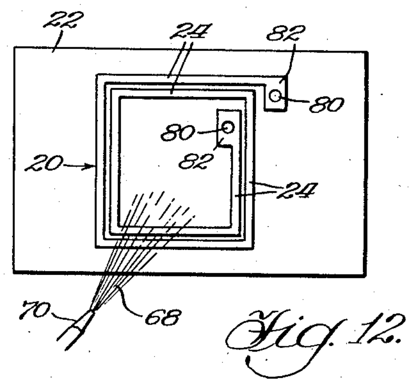
Fig. 12 is a schematic view representing the step of removing the resist.

After being electroplated, the article is treated with a suitable solvent to remove the mask or resist 56. As shown in Fig. 12, a solvent spray 68 is directed from a nozzle 70 onto the work. This may be done also by immersion or in a redistilling vapor chamber. When the masking layer has been thoroughly removed, the article appears in sectionas shown in Fig. 11, with the copper strips 24 covering certain areas of the silver layer 28. The silver is exposed in those areas that are not covered by copper.

Figure 13:
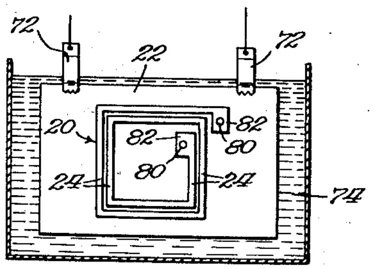
Fig. 13 represents the step of treating the article with the conversion agent.
Figure 14:
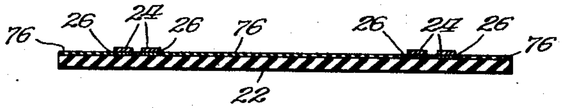
Fig. 14 is a cross-section of the article after being treated with the conversion agent.

The next step is to subject the exposed silver to the action of a conversion agent for rendering it electrically non-conductive and soluble in a cleaning agent. Fig. 13 represents the article 22 (Fig. 11) suspended by clips 72 in a bath 74 containing a converter. Excellent results have been obtained by using ordinary bleach (sodium hypochloride, NaOCl) as the converter. As far as can be observed, the bleach does not react chemically with the copper strips 24, but it changes the exposed silver layer 28 to a layer of non-conductive material 76, Fig. 14. This converted silver compound 76, Fig. 14, may be left on the base 22 if desired, inasmuch as it is a good insulator. Preferably, however, it is removed. A useful property of this compound is its solubility in photograper's "hypo" (sodium thiosulphate, $Na_2S_2O_3$) or in ammonia (ammonium hydroxide, $NH_4OH$). Such cleaning agents do not affect the copper 24 for the short-time contact, nor do they undercut the individual silver layers 26 beneath the copper. They remove the silver compound 76 to the edge of each conductor 24, leaving the bare insulating base 22 with clean, sharply defined conductors thereon. The end result is as shown in Fig. 2.

Figure 15:
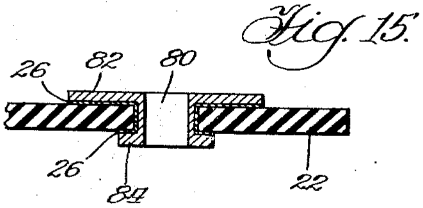
Fig. 15 is a fragmentary section on the line 15—15 in Fig. 1, showing the configuration of a terminal socket.

Terminal holes 80, Fig. 1, may be formed in the base 22. These holes 80 are surrounded by wide end portions 82 of the looped conductor 24. When the base 22 is coated with silver, all surfaces are covered, including edges and bores of holes. Masking is applied to all surfaces, one stencil for each flat side, thus controlling the coppered areas. When the work is copper-plated, the copper lines each hole 80 and forms a small eyelet 84, Fig. 15, around the hole 80 on the reverse side of the base 22. This affords good electrical contact with a terminal inserted in the hole 80 and also helps to anchor the terminal portion 82 of the copper strip to the base 22.

In illustrating the invention, a relatively simple conductor pattern has been shown. It is obvious, of course, that the principles of the invention can be applied to any complex design. Isolated conductors can be formed on the same insulating base in a single operation. Conductors may be formed likewise on both sides of the base and electrically interconnected through holes such as 80. This may be useful, for example, where it is desired to run a conductor along one side of the base for a distance, then continue the conductor on the other side of the base to avoid a short circuit. The deposited metal lining the hole interconnects the two displaced parts of the conductor under these circumstances. Many other applications of the invention will be evident to those skilled in the art.

When the hypo solution which is used for removing the silver compound from the base becomes saturated, it can be used as a bath to silver-plate the copper conductors 24. The article is immersed in the hypo and when it is removed therefrom, the copper strips will have silver coatings thereon. This facilitates soldering and protects the copper from corrosion. The article may then be lacquered as a further protection.

Another conversion agent which may be employed in lieu of sodium hypochlorite is a solution of chromic acid ($Cr_2O_3$) with about 10 percent of sulphuric acid (optional). This converts the unplated silver to a chromate which is readily wiped off with water or which disappears in a "hypo" solution. Chromic acid has far less effect upon the copper plating than do other acid solutions (such as nitric acid) which have been used in the past. However, it may tend to remove a slight amount of the copper. To circumvent this, the copper strips may be silver-plated in the manner suggested above before the article is subjected to the action of the converter. During the short time that the converter is in operation, it will exhaust itself upon the silver and leave the copper practically unaffected.

Figure 6:
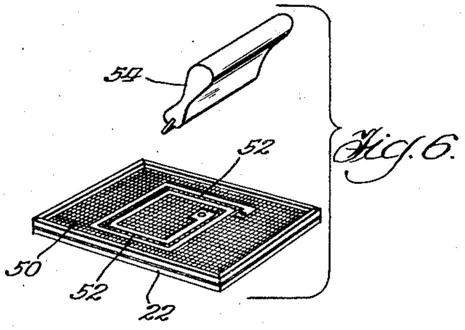
Fig. 6 is a simplified perspective view of printing equipment used for stenciling the base.

The disclosed method of forming conductors upon an insulating base has proved very successful in practice. The application of resist to the base through a stencil, as shown in Fig. 6, provides a thick layer of resist that does not break down in the electroplating operation, and it also provides sharply defined walls for the copper conductors as they are "growing" on the silver. Furthermore, the use of conversion agents, such as those specified herein, having no perceptible effect, or only a very weak effect, upon copper for eliminating the excess silver is believed to be an important advance in the art.

While there has been described what is considered at present to be the preferred embodiment of the invention, it is contemplated that such embodiment may be modified without departing from the principles of the invention as set forth in the appended claims.

I claim:

1. A method of forming an electric conductor upon an insulating base which comprises the steps of coating the base with a layer of metallic silver, masking with a resist those areas of the base on which no conductor is desired, leaving unmasked the area on which a conductor is desired, electroplating copper onto the silver in the unmasked area of the coated base to form an electric conductor, removing the resist from the base, and applying sodium hypochlorite to the base for chemically converting the unplated parts of the silver to a non-conductive material.

2. A method of forming electric conductors upon an insulating base which comprises the steps of coating the base with a layer of metallic silver, applying to said base a non-conductive material resistant to electrolysis for masking those areas of the base on which no conductor is desired, leaving unmasked the areas on which conductors are desired, electroplating copper onto the silver in the unmasked areas of the coated base to form electric conductors, removing the non-conductive masking material from the base, applying sodium hypochlorite to the base for chemically converting the unplated parts of the silver to a silver compound soluble in a given cleaning agent, and applying the cleaning agent to the base for removing the silver compound therefrom.

3. A method of forming an electric conductor upon an insulating base which comprises the steps of coating the base with a layer of metallic silver, masking with a resist those areas of the silvered base on which no conductor is desired, leaving unmasked the area on which a conductor is desired, electroplating copper onto the silver in the unmasked area of the coated base to form an electric conductor, removing the resist from the base, subjecting the electroplated base to the action of sodium hypochlorite for converting the unplated silver to a compound soluble in sodium thiosulphate solution, and applying sodium thiosulphate solution to the base for removing the silver compound therefrom.

4. A method of forming an electric conductor upon an insulating base which comprises the steps of coating the base with a layer of metallic silver, masking with a resist those areas of the silvered base on which no conductor is desired, leaving unmasked the area on which a conductor is desired, electroplating copper onto the silver in the unmasked area of the coated base to form an electric conductor, removing the resist from the base, subjecting the electroplated base to the action of sodium hypochlorite for converting the unplated silver to a compound soluble in ammonium hydroxide solution, and applying ammonium hydroxide solution to the base for removing the silver compound therefrom.

5. A method of forming electric conductor portions upon a flat insulating base having at least one opening therein extending to both sides of the base which includes, coating the base on both sides thereof and in the opening with a layer of silver, stencil screening to the sides of the coated base a non-conductive resist material resistant to electrolysis to mask those areas of the base on which no conductor is desired and to leave unmasked the opening and those areas of the base on which a conductor is desired, electroplating onto the unmasked areas of the base and in the opening a layer of copper having sufficient thickness to serve as an electric conductor and having portions thereof interconnected through the opening, removing the non-conductive resist material, and applying sodium hypochlorite to the base for chemically converting the unplated portions of the silver layer to a non-conductive material.

References Cited in the file of this patent

UNITED STATES PATENTS

| | | |
|---|---|---|
| 653,024 | King | July 3, 1900 |
| 1,335,176 | Merritt | Mar. 30, 1920 |
| 1,563,731 | Ducas | Dec. 1, 1925 |
| 1,758,293 | Murray | May 13, 1930 |
| 1,942,686 | Colbert et al. | Jan. 9, 1934 |
| 1,966,330 | Burwell, Jr. | July 10, 1934 |
| 2,014,524 | Franz | Sept. 17, 1935 |
| 2,092,636 | Brossman | Sept. 7, 1937 |
| 2,214,646 | Walker | Sept. 10, 1940 |
| 2,225,734 | Beebe | Dec. 24, 1940 |
| 2,255,440 | Sherman | Sept. 9, 1941 |
| 2,441,960 | Eisler | May 25, 1948 |
| 2,443,119 | Rubin | June 8, 1948 |
| 2,465,105 | Levi | Mar. 22, 1949 |

OTHER REFERENCES

Printed Circuit Techniques, Nat. Bureau of Standards Circular 468, No. 15, 1947, pp. 10–12 and 20.

Metallizing Non-Conductors, by Samuel Wein, 1945, pages 24–30.